(12) United States Patent
Kim et al.

(10) Patent No.: US 7,719,170 B1
(45) Date of Patent: May 18, 2010

(54) SELF-FOCUSING ACOUSTIC TRANSDUCER WITH FRESNEL LENS

(75) Inventors: Eun Sok Kim, Rancho Palos Verdes, CA (US); Hongyu Yu, Los Angeles, CA (US); Chuang-Yuan Lee, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 299 days.

(21) Appl. No.: 12/013,413

(22) Filed: Jan. 11, 2008

Related U.S. Application Data

(60) Provisional application No. 60/884,600, filed on Jan. 11, 2007.

(51) Int. Cl.
*H01L 41/08* (2006.01)
(52) U.S. Cl. .................................... 310/335
(58) Field of Classification Search ............. 310/334, 310/335
See application file for complete search history.

(56) References Cited

U.S. PATENT DOCUMENTS

| | | | |
|---|---|---|---|
| 4,562,900 A | 1/1986 | Anderson et al. | |
| 5,339,101 A | 8/1994 | Rawson et al. | |
| 5,477,249 A | 12/1995 | Hotomi | |
| 5,521,140 A | 5/1996 | Matsuda et al. | |
| 5,565,113 A | 10/1996 | Hadimioglu et al. | |
| 5,713,673 A | 2/1998 | Nemoto et al. | |
| 5,781,210 A | 7/1998 | Hirano et al. | |
| 5,847,732 A | 12/1998 | Shinozaki et al. | |
| 5,877,789 A | 3/1999 | Reinten | |
| 5,898,446 A | 4/1999 | Moriyama | |
| 5,903,291 A | 5/1999 | Yoshimura et al. | |
| 6,221,653 B1 | 4/2001 | Caren et al. | |
| 6,228,659 B1 | 5/2001 | Kowallis et al. | |
| 6,255,119 B1 | 7/2001 | Baier | |
| 6,364,459 B1 | 4/2002 | Sharma et al. | |
| 6,447,723 B1 | 9/2002 | Schermer et al. | |
| 6,682,214 B1* | 1/2004 | Vivek et al. ................. | 366/108 |
| 7,332,127 B2 | 2/2008 | Kim et al. | |
| 7,360,422 B2 | 4/2008 | Madni et al. | |
| 2002/0141607 A1* | 10/2002 | Azima et al. ................ | 381/152 |
| 2003/0027344 A1 | 2/2003 | Kim et al. | |
| 2004/0010196 A1* | 1/2004 | Wang et al. ................. | 600/476 |
| 2006/0075807 A1 | 4/2006 | Elrod | |
| 2006/0225506 A1 | 10/2006 | Madni et al. | |

(Continued)

FOREIGN PATENT DOCUMENTS

WO 01/21291 3/2001

(Continued)

OTHER PUBLICATIONS

Chan, S.C., et al., "Finite element analysis of multilevel acoustic Fresnel lenses," *IEEE Transactions on Ultrasonics, Ferroelectrics and Frequency Control*, 43(4):670-677, Jul. 1996.

(Continued)

*Primary Examiner*—Thomas M Dougherty
(74) *Attorney, Agent, or Firm*—Fish & Richardson P.C.

(57) ABSTRACT

Techniques, apparatus and systems that use an acoustic transducer with a Fresnel lens to focus an acoustic wave for various applications, including acoustic droplet ejectors.

10 Claims, 17 Drawing Sheets

U.S. PATENT DOCUMENTS

2007/0193353 A1     8/2007     Kim et al.

FOREIGN PATENT DOCUMENTS

WO     03/006164     1/2003

OTHER PUBLICATIONS

Demirci, U., "Droplet-based photoresist deposition," *Applied Physics Letters*, 88(14):144104.1-144104.3, Apr. 2006.

DeRisi, J.L., et al., "Exploring the Metabolic and Genetic Control of Gene Expression on a Genomic Scale," *Science*, 278(5338):680-686, Oct. 1997.

Duggan, D.J., et al., "Expression profiling using cDNA microarrays," *Nature Genetics Supplement*, 21:10-14, Jan. 1999.

Elrod, S.A., et al., "Nozzleless droplet formation with focused acoustic beams," *Journal of Applied Physics*, 65(9):3441-3447, May 1989.

Hadimioglu, B., et al., "Acoustic Ink Printing," *Proceedings IEEE Ultrasonics Symposium*, vol. 2, pp. 929-935, Oct. 1992.

Hebner, T.R., et al., "Ink-jet printing of doped polymers for organic light emitting devices," *Applied Physics Letters*, 72(5):519-521, Feb. 1998.

Hsieh, H.B., et al., "Ultra-High-Throughput Microarray Generation and Liquid Dispensing Using Multiple Disposable Piezoelectric Ejectors," *Journal of Biomolecular Screening*, 9(2):85-94, (2004).

Huang, D., et al., "Micromachined acoustic-wave liquid ejector," *Journal of Microelectromechanical Systems*, 10(3):442-449, Sep. 2001.

Laurell T. et al. "Silicon microstructures for high-speed and high-sensitivity protein identifications," *Journal of Chromatography B*, 752(2):217-232, Mar. 2001.

MacBeath, G., et al., "Printing Proteins as Microarrays for High-Throughput Function Determination," *Science*, 289(5485):1760-1763, Sep. 2000.

Percin, G., et al., "Controlled ink-jet printing and deposition of organic polymers and solid particles," *Applied Physics Letters*, 73(16):2375-2377, Oct. 1998.

Rozenberg, G.G., et al., "Patterned low temperature copper-rich deposits using inkjet printing," *Applied Physics Letters*, 81(27):5249-5251, Dec. 2002.

Schena, M., et al., "Quantitative Monitoring of Gene Expression Patterns with a Complementary DNA Microarray," *Science*, 270(5235):467-470, Oct. 1995.

Xu, T., et al., "Inkjet printing of viable mammalian cells," *Biomaterials*, 26(1):93-99, Jan. 2005.

\* cited by examiner

Photos of droplet formation sequences.

Photos showing stable and continuous directional droplet ejections: (a) at the beginning of the ejections and (b) after 1,800 droplet ejections. In (c) that is the top-view photo of the directional ejector, we can see the pie-shaped electrode and the lens pattern.

FIG. 17  Photos of the droplets ejected at an ejection rate of (a) 1 kHz and (b) 2 kHz by the directional ejector.

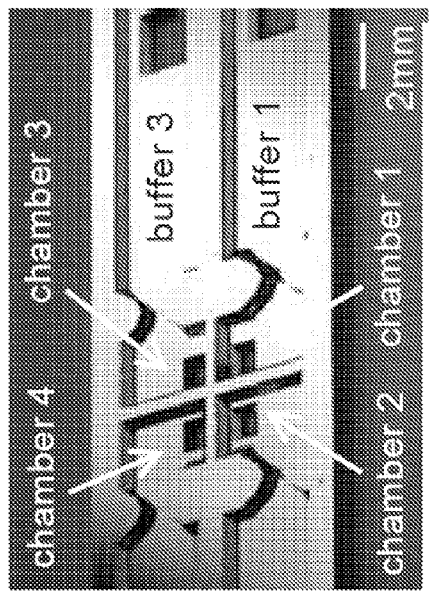
*FIG. 19A*
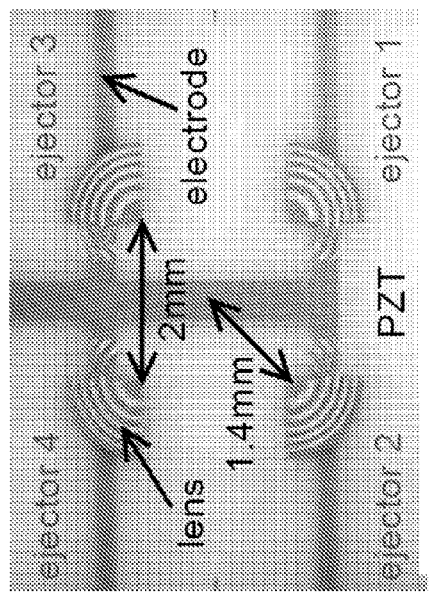
*FIG. 19B*
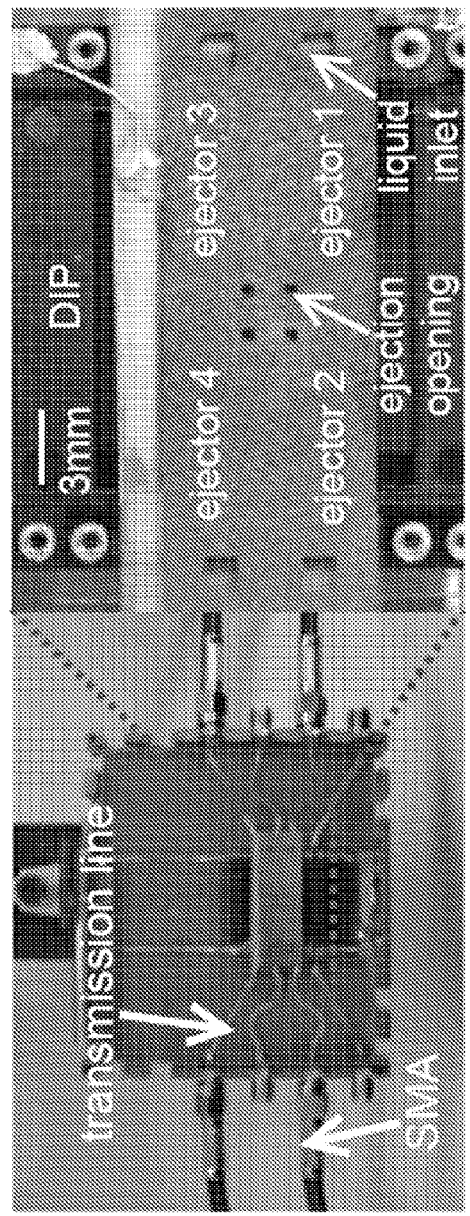
*FIG. 20A*
*FIG. 20B*

SELF-FOCUSING ACOUSTIC TRANSDUCER WITH FRESNEL LENS

PRIORITY CLAIM AND RELATED APPLICATION

This application claims the benefit of U.S. Provisional Patent Application No. 60/884,600 entitled "Self-Focusing Acoustic Transducers with Fresnel Reflector/Absorber Lens" and filed on Jan. 11, 2007, the entire disclosure of which is incorporated by reference as part of the specification of this application.

FEDERALLY SPONSORED RESEARCH OR DEVELOPMENT

The U.S. Government may have certain rights in this invention pursuant to Grant No. ECS0310622 awarded by the National Science Foundation.

BACKGROUND

This application relates to acoustic transducers and their applications.

Acoustic transducers can be used to generate acoustic waves. Like optical waves, acoustic waves can be reflected and refracted at an interface between two different acoustic media and can be focused.

SUMMARY

This application describes, among others, techniques, apparatus and systems based on acoustic transducers.

One example of an acoustic transducer device in this application includes an acoustic unit to generate an acoustic wave; and an acoustic Fresnel lens formed on one side of the acoustic unit to focus the acoustic wave and structured to comprise (1) concentric annular Fresnel rings that are made of an acoustic transmitting material and transmit acoustic energy and (2) acoustic blocking rings that interleave with the Fresnel rings and block transmission of acoustic energy, wherein the acoustic blocking rings include a material that is different from the acoustic transmitting material.

This and other acoustic transducer devices can be used in a wide range of applications such as liquid drop ejectors for printing and liquid dispensing in biological and chemical instrument and devices.

These and other implementations and their variations are described in detail in the attached drawings, the detailed description and the claims.

BRIEF DESCRIPTION OF THE DRAWINGS

FIGS. 14, 15, 16, 17, 18, 19A, 19B, 20A and 20B show examples of directional ejectors.

DETAILED DESCRIPTION

Figure 1:
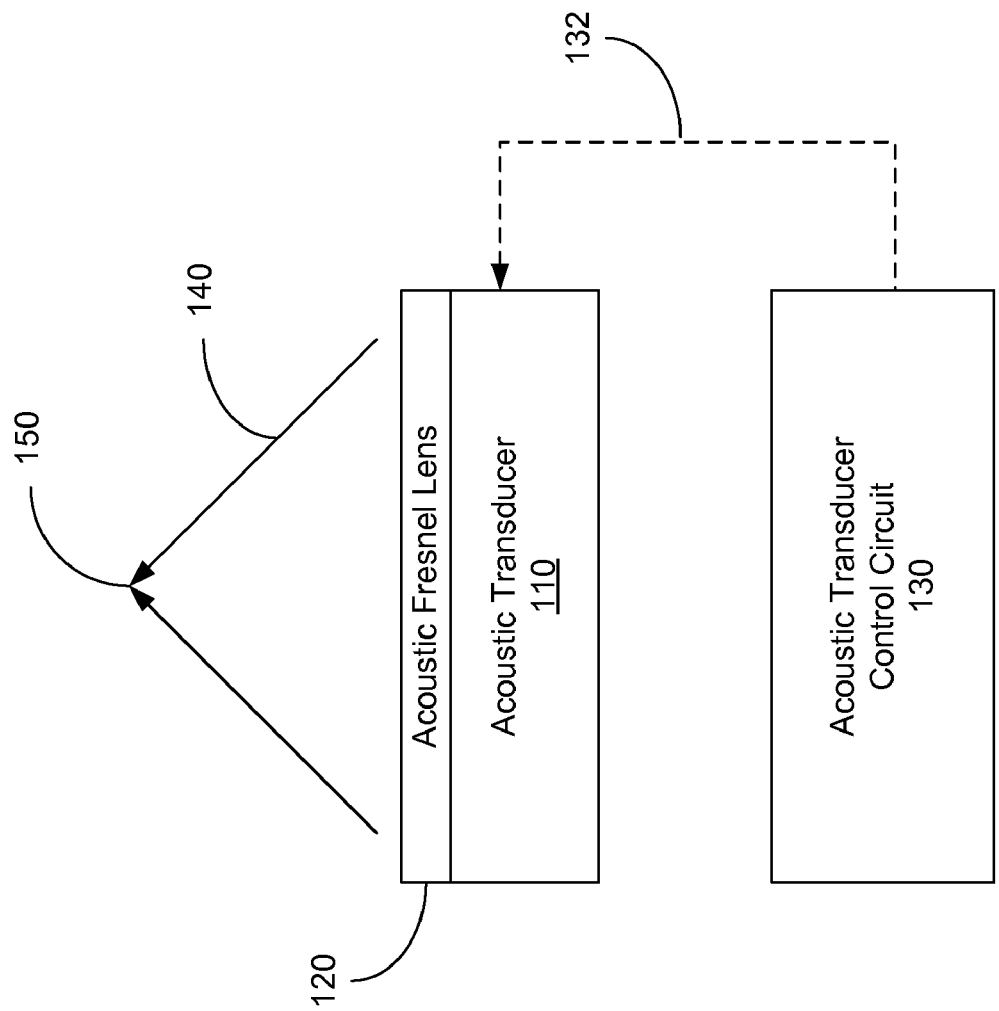
FIG. 1 shows one example of an acoustic transducer device using an acoustic Fresnel lens.

FIG. 1 shows one example of an acoustic transducer device using an acoustic Fresnel lens. This acoustic transducer device includes an acoustic transducer unit 110 to generate an acoustic wave 140 an acoustic Fresnel lens 120 formed on one side of the acoustic unit 110 to focus the acoustic wave 140 at a focus location 150. A control unit 130 is connected to the acoustic transducer unit 110 and to supply a control signal 132 to control the operation of the acoustic transducer unit 110.

The acoustic unit 110 can be a PZT acoustic transducer or other acoustic transducer. The acoustic Fresnel lens 120 is structured to include (1) concentric annular Fresnel rings that are made of an acoustic transmitting material and transmit acoustic energy and (2) acoustic blocking rings that interleave with the Fresnel rings and block transmission of acoustic energy, wherein the acoustic blocking rings include a material that is different from the acoustic transmitting material.

Figure 2:
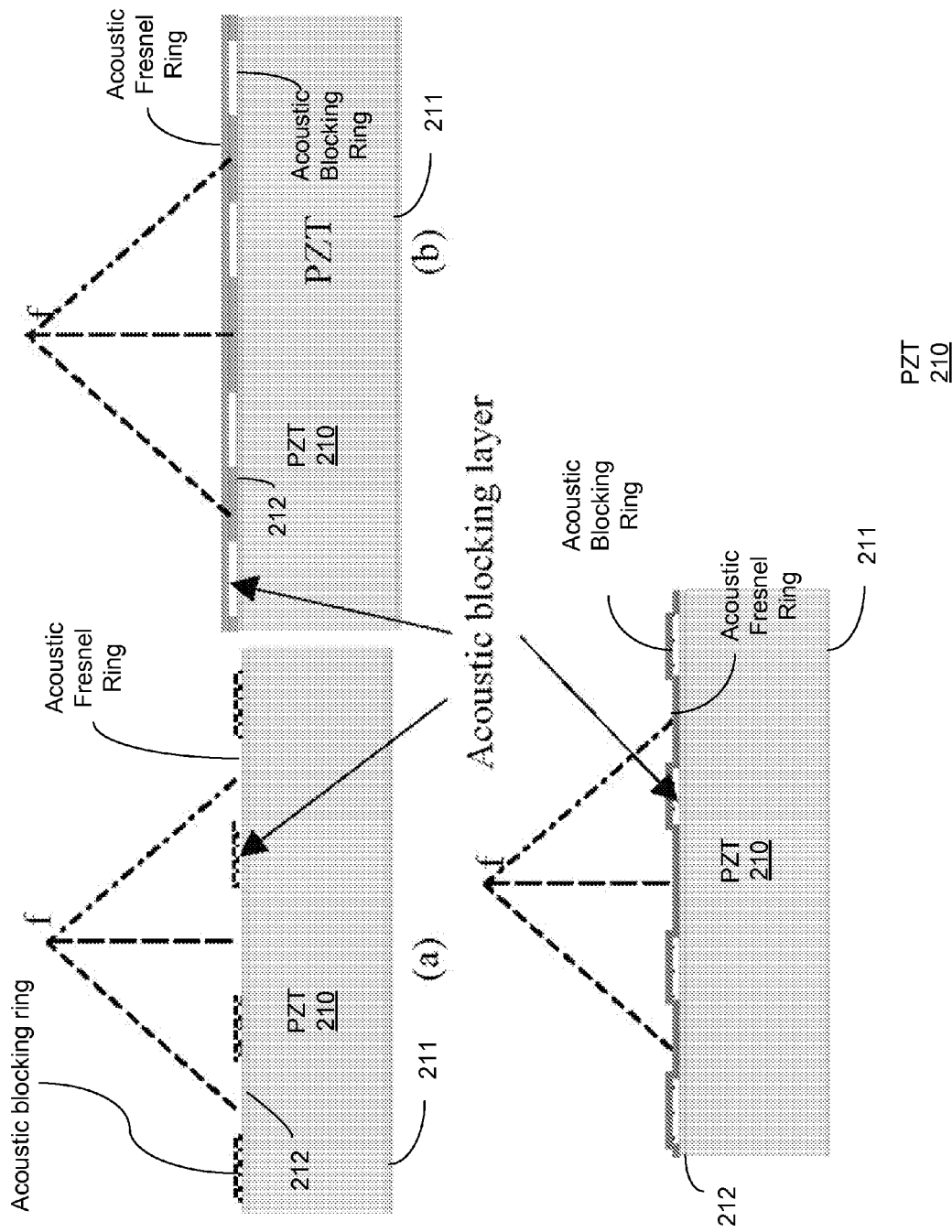
FIG. 2 shows examples of the acoustic Fresnel lens formed on an acoustic transducer.

FIG. 2 shows examples of the acoustic Fresnel lens 120 formed on a PZT acoustic transducer. The PZT acoustic transducer includes a piezoelectric layer 210 that exhibits an piezoelectric effect under a control voltage; a first contiguous conductive layer 211 formed on a first side of the piezoelectric layer 210 as a first electrode; and a second contiguous conductive layer 212 formed on a second, opposite side of the piezoelectric layer 210 as a second electrode which is electrically biased with respect to the first electrode 211 to apply the control voltage to the piezoelectric layer 210 to cause the piezoelectric layer to generate an acoustic wave. The acoustic Fresnel lens 120 is formed on the second electrode 212.

The acoustic blocking rings in FIG. 2 can be implemented in different configurations. FIG. 2(a) shows a user of a patterned acoustic absorptive layer such as a porous material to form the acoustic blocking rings. A material such as a polymer material can be made to be highly porous to block transmission of the acoustic wave. For example, an air gel material can be made to be porous with more than 90% air. Such porous materials can be formed from silica, metal oxides, and organic chemicals, and are produced by drying gels—networks of linked molecules suspended in a liquid—so that air fills the spaces previously occupied by the liquid. Aerogels were first produced by US scientist Samuel Kristler in the early 1930s by drying silica gels at high temperatures and pressures.

FIG. 2(b) shows an example for the acoustic Fresnel lens in a planar structure that includes concentric annular air channel rings as the acoustic blocking rings. For example, a partially-etched Si wafer can be bonded to the PZT transducer to form encapsulated air cavities to reflect the acoustic waves.

FIG. 2(c) shows another example of an acoustic blocking ring design that is made air cavities encapsulated with a polymer (e.g., parylene) layer. This structure can be formed through depositing and patterning photoresist followed by encapsulating the photoresist with water proof material (such as parylene) and removing the photoresist to form the air cavities. A polymer material such as a parylene coating can be used to form such a structure that is uniform and substantially free of voids.

There exist many choices of materials for (1) the encapsulation layer on top of the acoustic blocking layer and (2) the layers that directly contact the PZT transducer. The materials used in this application are examples of such materials and can be replaced by others based on the requirements or needs of specific applications.

The devices shown in FIGS. 1 and 2 can be used for various applications. The following sections provide specific examples for liquid drop ejectors.

The interest in creating and controlling picoliter microdroplets is growing rapidly, driven by emerging applications in biomedicine, chemistry, and pharmaceutics. Various droplet-dispensing mechanisms have been developed and employed to realize high resolution, fast and reliable biochemical assay at low cost. The techniques and devices described in this application can be used to provide droplet dispensing without direct contact to shoot out bio-chemical microdroplets onto a chip surface or other target surface. Such devices are examples of nozzleless dispensing devices based on acoustic actuations.

Figure 3:
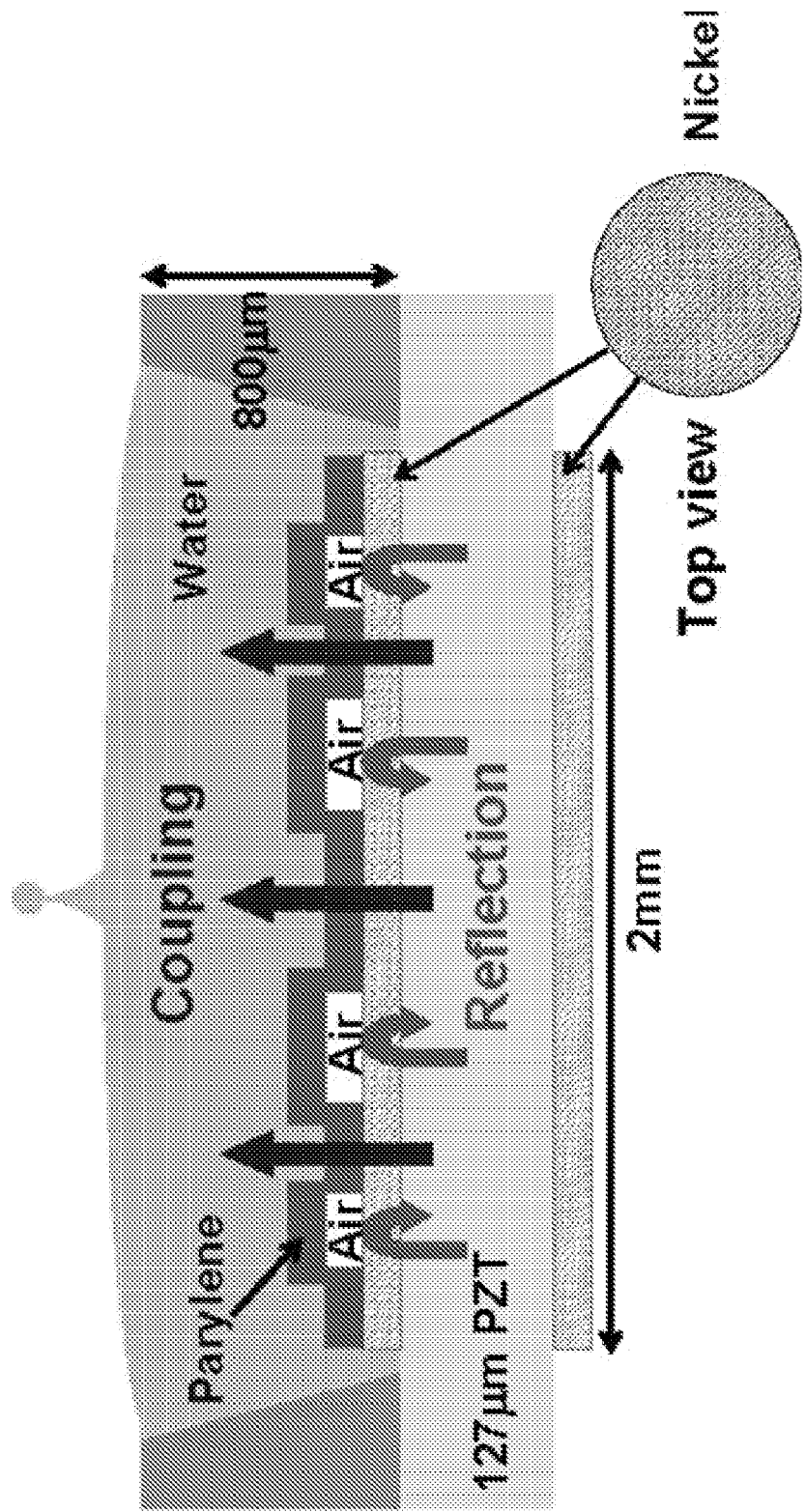
FIG. 3 shows a liquid drop ejector based on an acoustic transducer device using an acoustic Fresnel lens.

Referring back to FIG. 1 and FIG. 2, an acoustic beam focused on the liquid surface can overcome the restraining surface tension and expel liquid droplets from an open space without any nozzle. A variety of acoustic focusing mechanisms have been reported. The Fresnel lens can be made to be planar and use the Fresnel rings to provide the focusing. Therefore, the electrodes for the PZT layer can be contiguous. This design can mitigate the electrode alignment issue. The examples in FIG. 2 are a microsurface structure on top of the piezoelectric transducer that blocks out or absorbs the acoustic waves on certain areas. Such a Fresnel lens structure can operate as a lens with reflectors or absorber based on the innate acoustic impedance mismatch between a solid and (1) a low acoustic impedance material such as air or (2) a highly absorptive layer such as a porous layer. This new type of lens has large tolerance for its geometry, particularly the thickness dimensions, and has been shown to be very effective in focusing acoustic waves. Its potential applications include droplet ejection, atomization of liquid, underwater thrusting, etc FIG. 3 shows a liquid drop ejector based on the design in FIG. 2(c). The lens design in FIG. 2(c) is a Lens with Air Reflector (LWAR). The air has an acoustic impedance much smaller than any solids, LWAR can be used to focus the acoustic waves.

The ejector in this example includes an acoustic transducer and a lens with air-reflectors. The 127-μm-thick lead zirconate titanate (PZT) sheet (with the fundamental thickness-mode resonance frequency of 18 MHz) sandwiched between two nickel electrodes serves as the acoustic transducer. Due to impedance mismatch, the acoustic waves produced by the PZT are mostly reflected at the transducer-air interface. To ensure efficient acoustic transmission, the lens structure was built with parylene (that is biocompatible), because its acoustic impedance (2.8 MRayl) is between that of water (1.5 MRayl) and the transducer (33 MRayl). As a result, the acoustic waves are transmitted into liquid through the parylene but reflected back by the air pockets as illustrated in FIG. 3.

The parylene lens is patterned into Fresnel half-wave bands (with the kth radius given by $\sqrt{k\lambda x(F+k\lambda/4)}$, where $\lambda$ and F are the acoustic wavelength and the lens focal length, respectively) so that the transmitted acoustic waves arrive at the liquid surface in phase, constructively interfering with each other and intensifying the acoustic pressure. The intensified acoustic beam ejects liquid droplets with their size primarily determined by the diameter of the focused acoustic beam that is directly related to the acoustic wavelength.

It is noted that for a conventional Fresnel lens, in order to get the desired 180° phase shift difference between the waves traveling through the liquid and through the lens, thickness of the lens material, h, should be tightly controlled to be $h=1/[2f(V_1^{-1}-V_s^{01})]$, where f is the frequency, and $V_1$ and $V_s$ are the acoustic velocities in the liquid and lens, respectively. However, unlike the conventional Fresnel lens, LWAR does not necessitate tight control over the parylene thickness or the gap distance of the air pocket.

Figure 4:
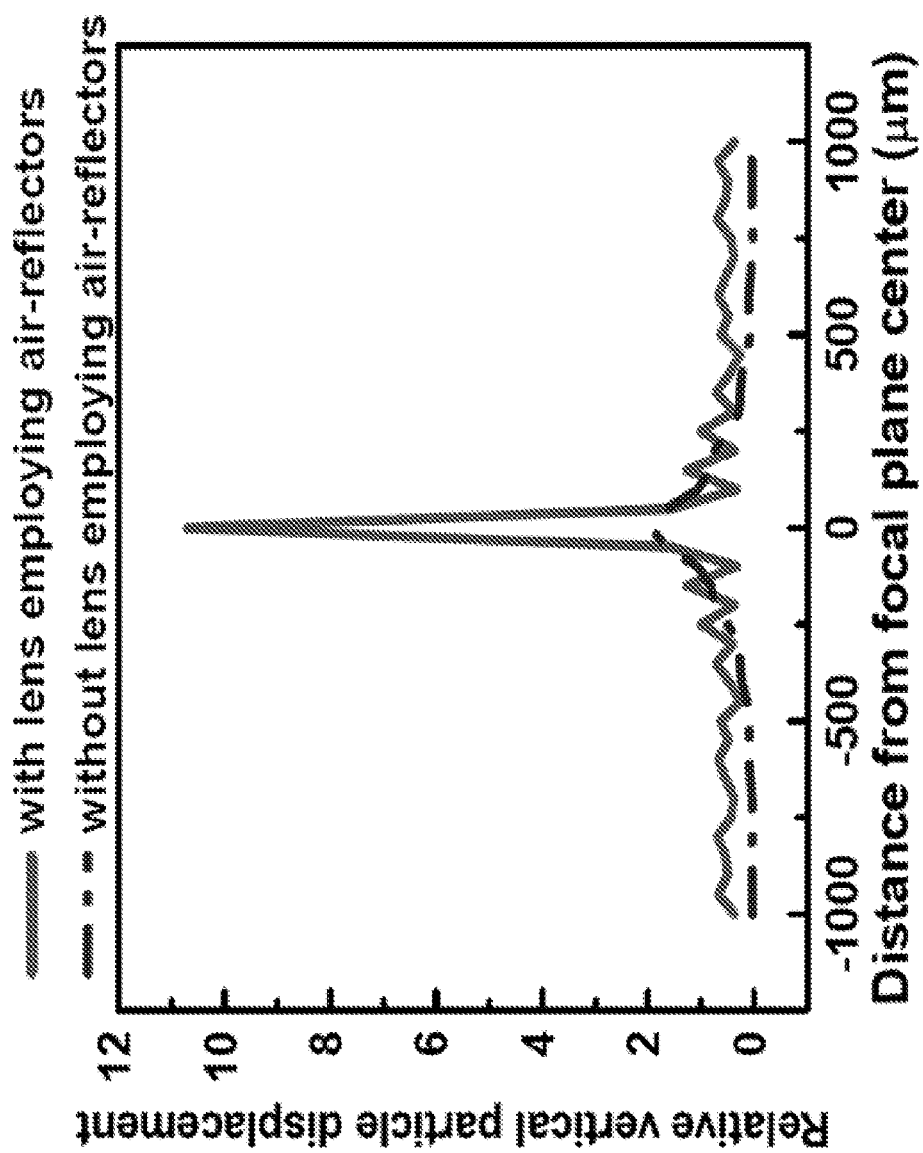
FIG. 4 shows vertical particle displacement on the top liquid surface for ejectors with and without lens.

In FIG. 3, the transducer has a symmetric pattern by having symmetric electrodes. Under this design, the acoustic wave has a symmetric profile and is focused by the Fresnel lens along a direction perpendicular to the PZT layer. Under the operation of the focused acoustic wave, a droplet is ejected in the vertical direction and is most related to the vertical particle displacement. FIG. 4 shows simulations of the droplet ejection to visualize the improved focusing effect of the lens as shown in FIG. 3. The ejector without lens is also shown for comparison. The sharp increase of the vertical particle displacement at the focal point indicates that the acoustic wave is well focused into a narrow beam width at the center of the top liquid surface. In the simulated ejector, the focused acoustic beam is 5.5 times stronger in intensity and 4 times narrower in width for the ejector with lens than without lens.

Figure 5:
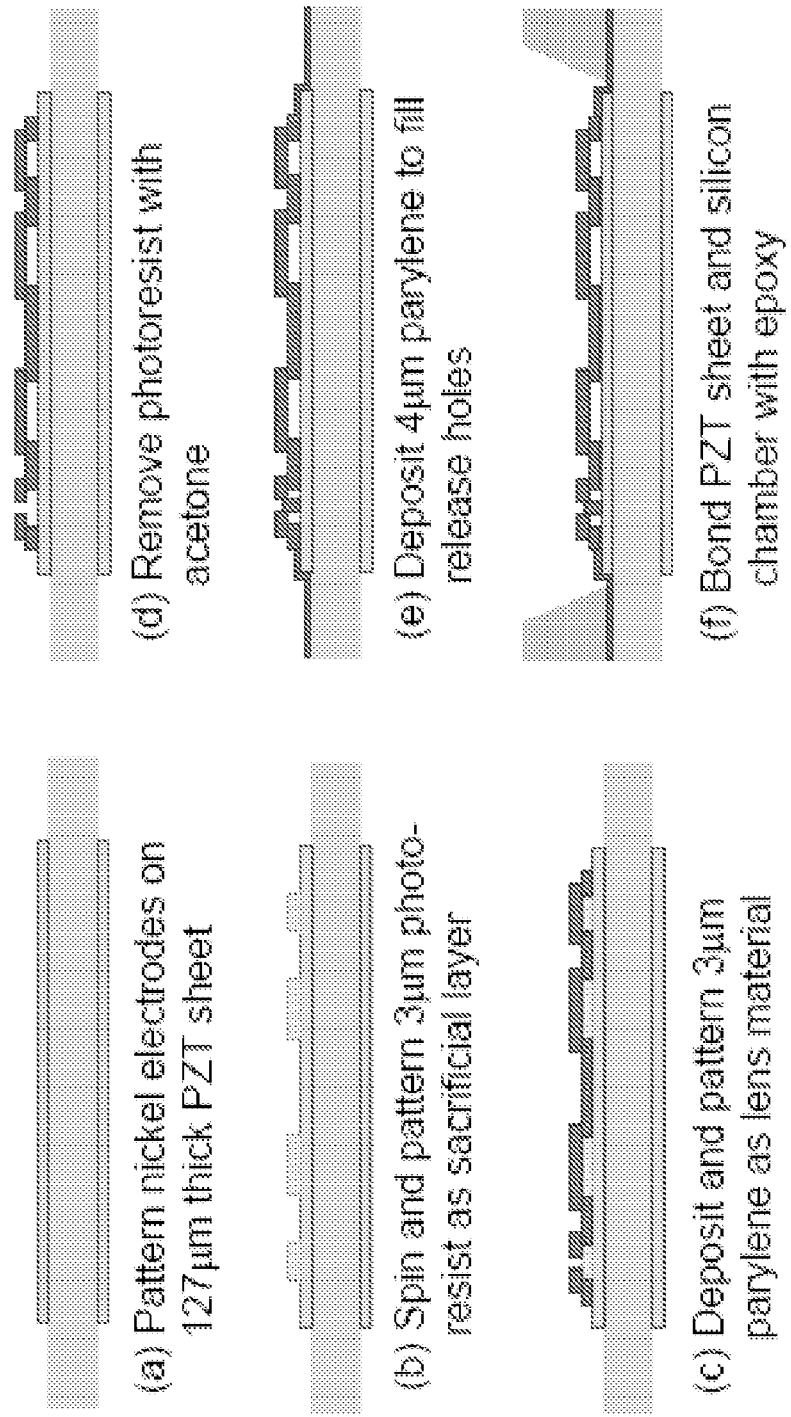
FIG. 5 shows exemplary fabrication steps for the ejector with the acoustic lens employing air-reflectors.

FIG. 5 shows one example for fabricating the device in FIG. 3. Based on this process, a test acoustic ejector was built on a 127-μm-thick PSI-5A4E PZT sheet (Piezo Systems, Cambridge, Mass.). On both sides of the PZT sheet, nickel electrodes were first patterned, followed by spinning and patterning of 3-μm-thick photoresist as the sacrificial layer. After depositing and patterning 3-μm-thick parylene as the lens material (with release holes of 30 μm in diameter), the photoresist was removed with acetone. Another 4-μm-thick parylene was then deposited to fill the release holes.

The microfluidic components (embedded microchannels, ejection chambers and reservoirs) were microfabricated with two silicon wafers. Both sides of silicon wafers were first deposited with 0.8-μm-thick SixNy by low-pressure chemical vapor deposition (LPCVD). The front-side SixNy was then patterned, followed by anisotropic etching of bulk silicon in KOH. After etching silicon for the microfluidic components, the SixNy was removed, and two silicon wafers were bonded together with epoxy. Finally, the PZT sheet was adhesively bonded to the silicon wafers in which the 800 μm deep (matching the lens focal length) chambers were microfabricated.

Since the release-hole sealing was realized with parylene coating, the formed air pocket was practically sealed in vacuum. Though parylene has a relatively small Young's modulus, since the dimensions of the air-reflector are also small, the ambient pressure was calculated not to cause significant structure deformation. Finite element analysis (FEA) software (Algor) was used to analyze the design. Simulation results showed that there was negligible displacement of less than 0.1 μm as one atmosphere static pressure is exerted on the parylene lens structure.

Figure 6:
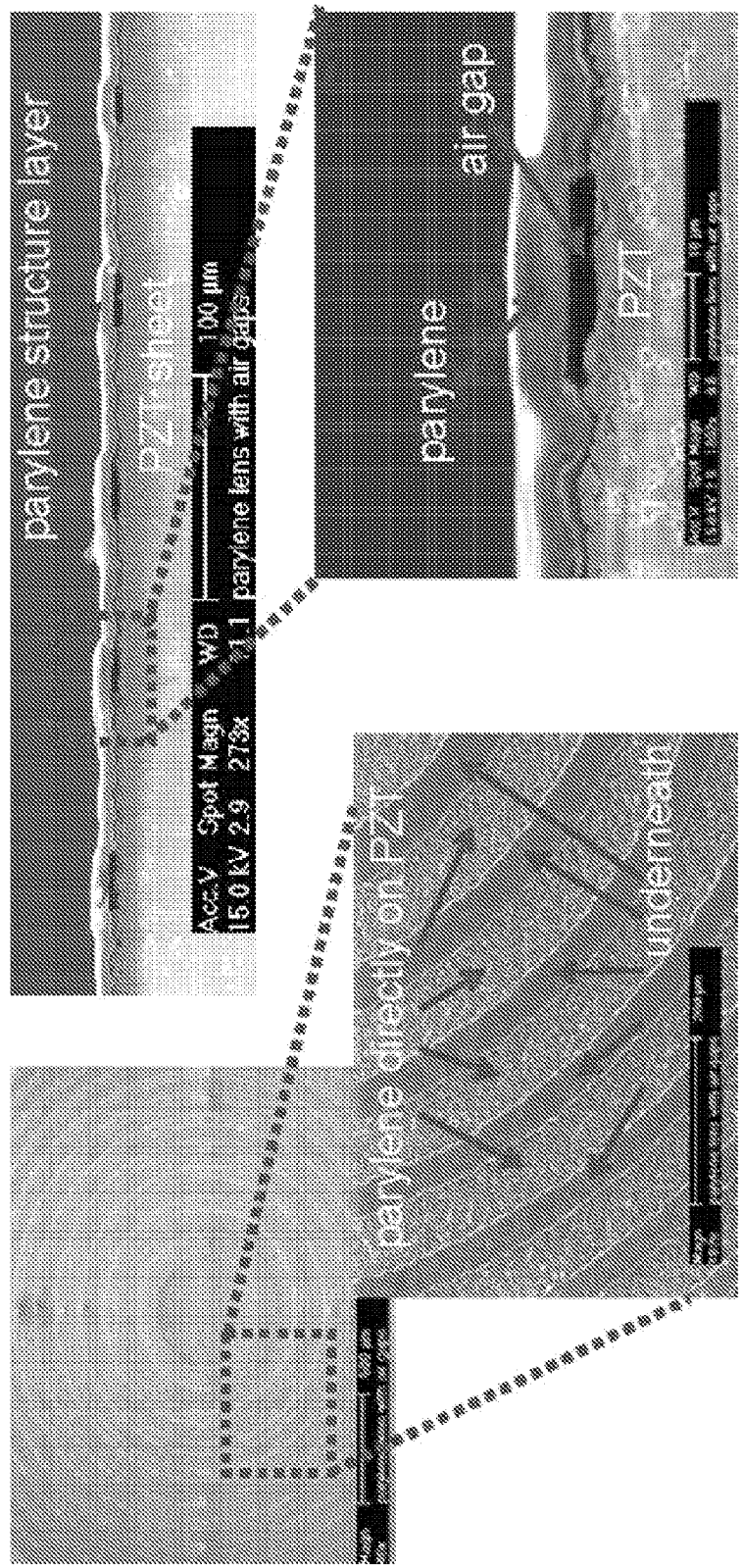
FIG. 6 shows SEM photos of the fabricated ejector with the acoustic lens employing air-reflectors: (a) top view and (b) side view

FIG. 6 shows the scanning electron microscope (SEM) photos of the fabricated devices.

Figure 7:
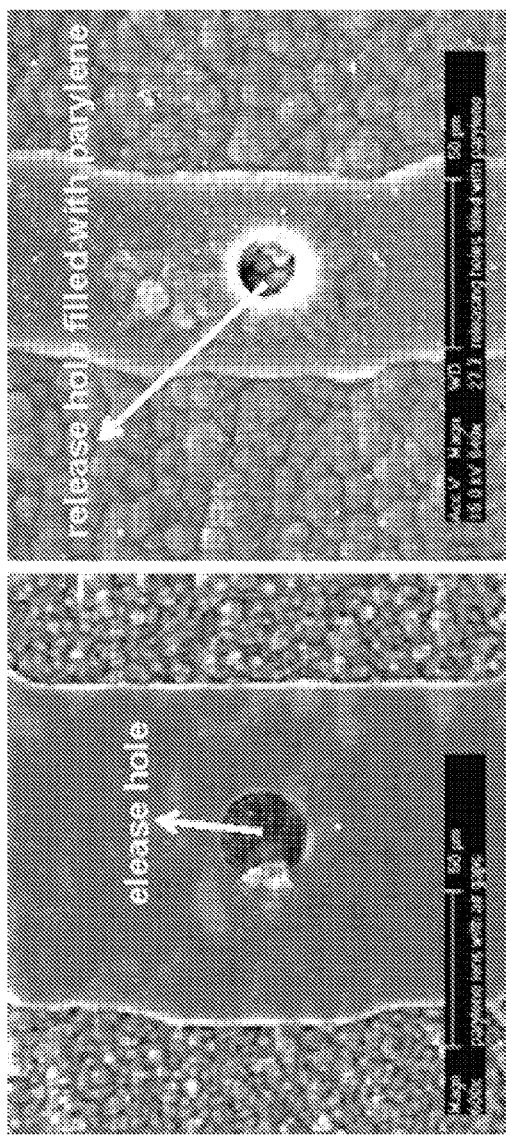
FIG. 7 shows SEM photos of the release holes: (a) before and (b) after being filled with parylene.
Figure 8:
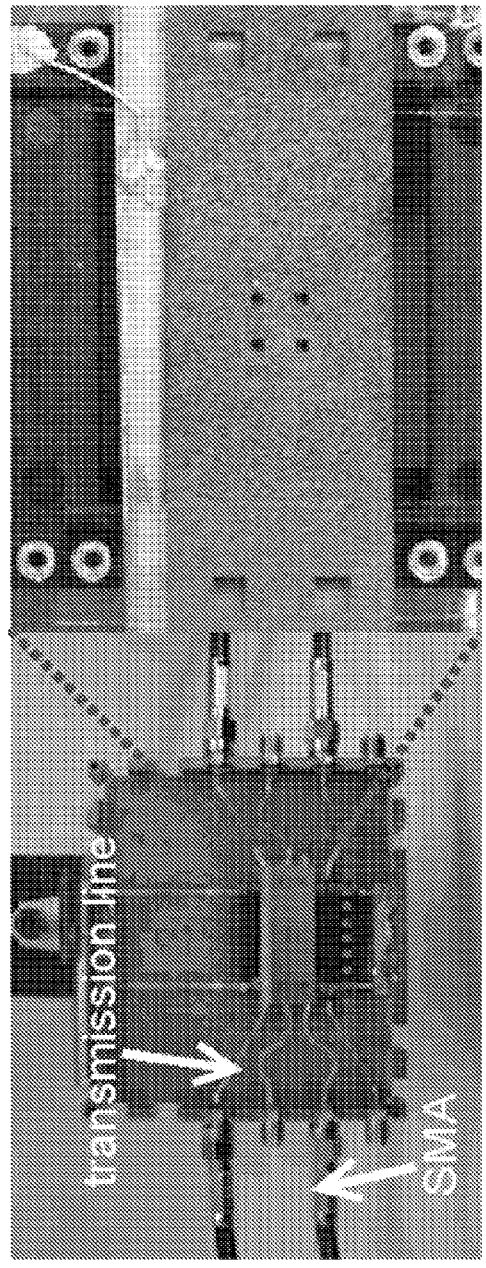
FIG. 8 shows the photos of the fabricated array of PZT ejectors and silicon chambers after they were adhesively bonded together.

FIG. 7 shows SEM photos of the release holes before and after being filled with parylene. The release holes are properly sealed and no deformation of parylene structure is observed FIG. 8 shows the photos of the fabricated array of PZT ejectors and silicon chambers after they were adhesively bonded together. The fabricated device was packaged in a dual-in-line (DIP) package, and the package was placed on a mounting station with high frequency microstrips.

An ejector without the lens has also been fabricated and tested for comparison. As expected, this ejector requires higher power (minimum pulsewidth of 20 µs) for ejection and the produced droplet size (165 µm) is larger due to lack of focusing effect. It is also found that the highest ejection rate for this ejector is only 500 Hz due to its larger droplet size and greater liquid mounting-up before ejection.

Figure 9:
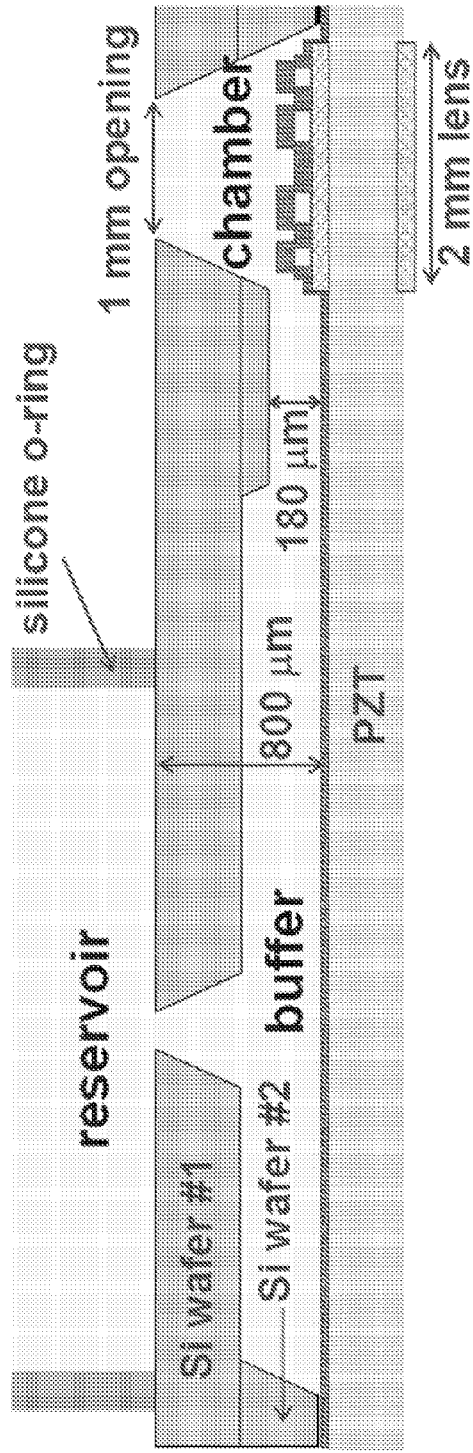
FIGS. 9 and 10 show examples of ejectors with reservoirs.
Figure 10:
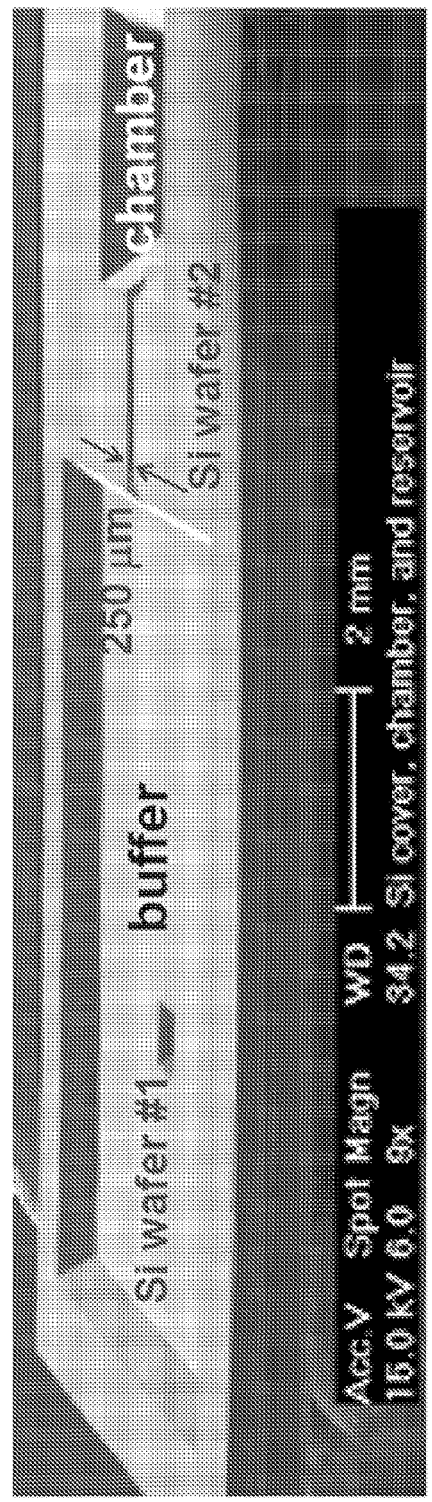

FIGS. 9 and 10 show examples of the ejector integrated with a reservoir, buffer and microchannel. The ejection chamber, buffer, and microchannel are microfabricated with two silicon wafers and bonded together with epoxy. Silicone O ring is used as a dam for the reservoir. Due to hydrostatic pressure and surface tension, all water in the reservoir is observed to be delivered to the ejection chamber, where the liquid level is maintained at the top surface of the silicon chamber, as the liquid is ejected out by the ejector. When driven with pulses of 7 µs pulse width at 60 Hz PRF, the ejector produces continuous ejection for more than 75 seconds, during which the RF frequency is fixed at 18 MHz without any fine tuning.

Figure 11:
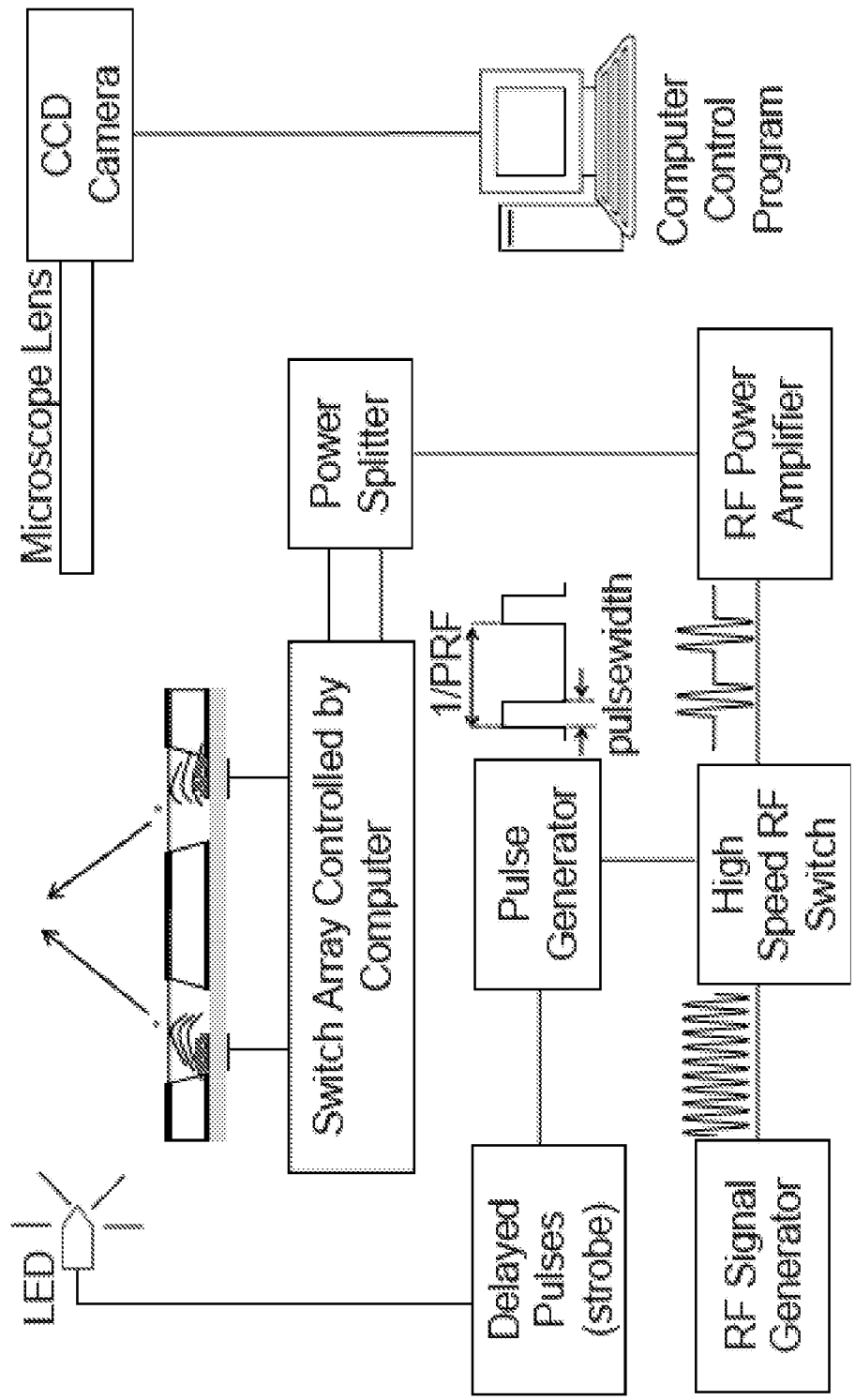
FIGS. 11, 12 and 13 show a test setup and testing results of ejectors.

FIG. 11 shows a test system. Pulses of 18-MHz sinusoidal signals are applied to the ejectors to eject droplets in this test system. First, an 18-MHz sinusoidal signal from a RF signal generator is passed through a high-speed RF switch that is modulated by a pulse generator. Pulse repetition frequency (PRF) from 1 Hz to 10 kHz is applied. The pulsed signal is amplified with an RF power amplifier and then fed into the device. For an array of four ejectors, the amplified pulsed signal is split into four equal signals through a power splitter and a low speed RF switch box, before being applied to each of the ejectors. A charge-coupled device (CCD) camera (SONY SSC-DC54A) with a microscope is placed horizontally to record the ejection process through stroboscopically blinking a light-emitting diode (LED). Synchronization of the flash illumination with the sinusoidal pulse input is achieved by turning on the LED with another pulse source triggered by the pulse generator that turns on and off the sinusoidal signal. By varying the delay time between the illumination of LED and the RF signal applied to the transducer, we observe the ejection process at any moment.

Figure 12:
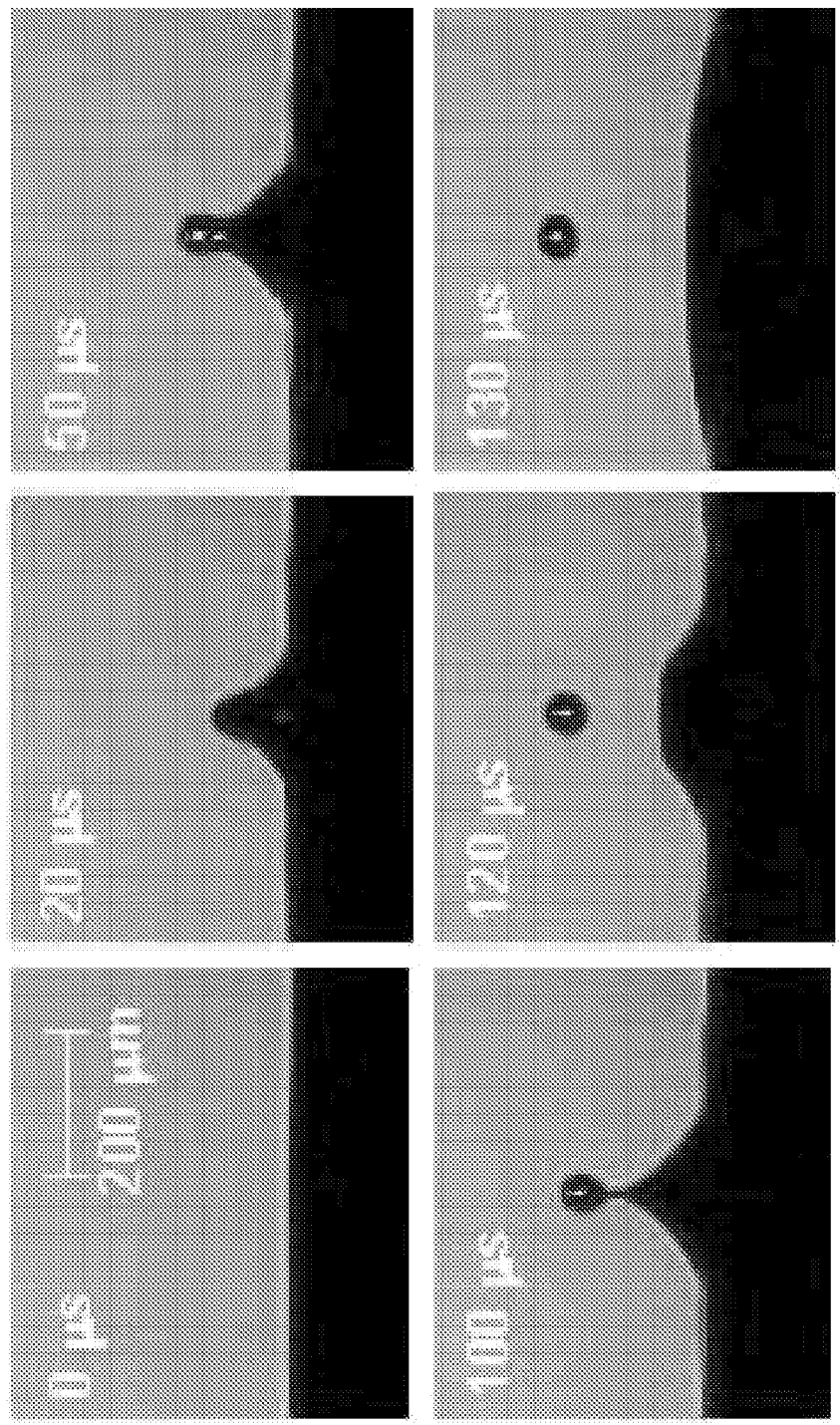

The fabricated ejector is driven with pulses of 18 MHz sinusoidal signals of ±60Vpeak-to-peak (the peak electrical field across the PZT substrate being around 0.47 MV/m). The time evolution of the droplet formation by a RF pulse having width of 7 µs and energy of 63 µJ is shown in FIG. 12. The droplet separation time and the liquid-surface relaxation time are estimated to be 100 µs and 130 µs, respectively. The droplet size of the acoustic ejector depends mostly on the wavelength of the acoustic wave (which is determined by the RF resonance frequency of the PZT substrate). For the same ejector driven with the same electrical condition, there is no observable variation in droplet size. For a set of 10 ejectors, the droplet size ranges from 70 µm to 80 µm due to the resonance frequency variations from the PZT substrate. The droplet size can be reduced by using a thinner PZT substrate (or film).

Figure 13:
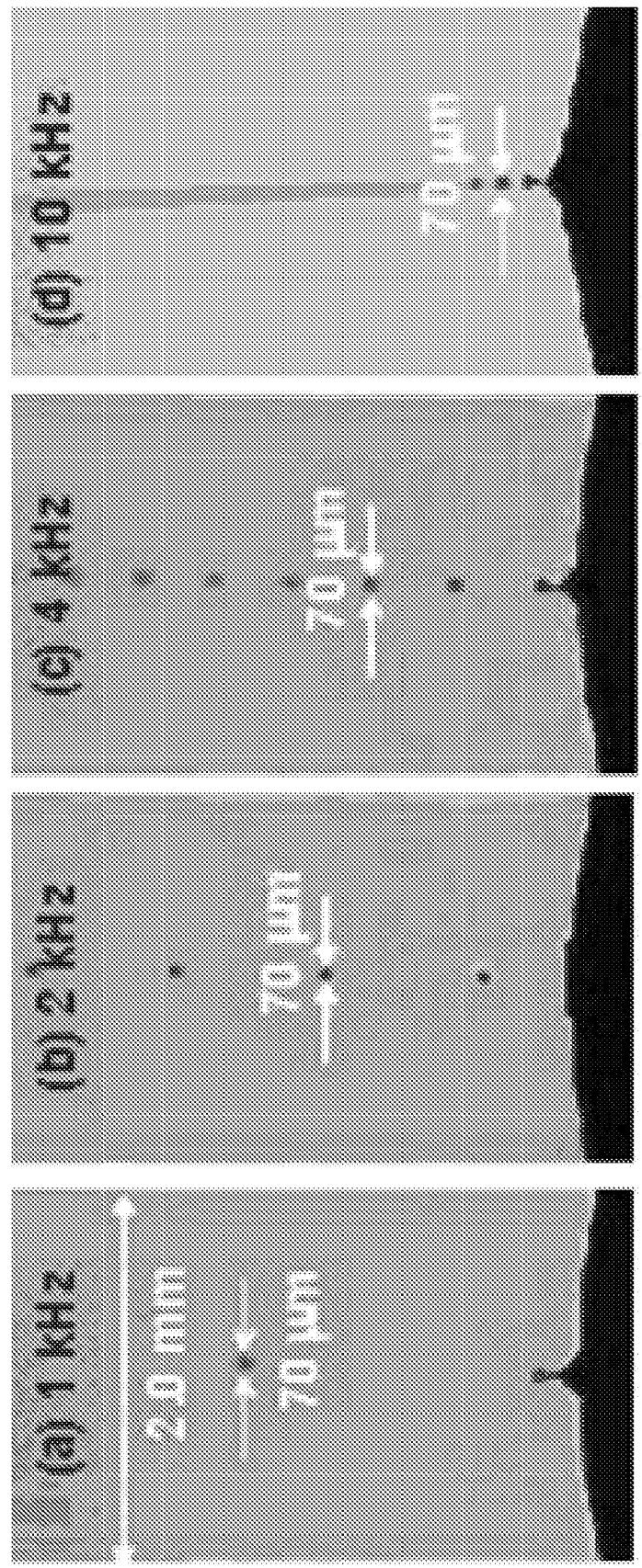

FIG. 13 shows the ejections at different ejection rates. The ejection is one droplet per pulse and free of satellite droplets. The images in FIGS. 13(a), (b), and (c) are a superposition of 16, 32, and 64 successive droplets, respectively, and the sharpness of the images demonstrates that the ejection speed is consistent (1.5 m/s); the droplet size is invariable (70 µm); and the formation process is consistent for every droplet ejection. Moreover, though the liquid-relaxation time is around 130 µs, ejection is observed at a rate up to 10 kHz, i.e. with an interval of 100 µs between two consecutive shootings, as shown in FIG. 13(d). This indicates the feasibility of ejection without the liquid-surface's returning to its flatness, and a higher ejection rate is achievable.

An asymmetrical electric field can be intentionally created within the piezoelectric layer to produce lopsided acoustic waves, which are focused on the liquid surface to obliquely eject droplets. This design can be used to form direction ejectors that eject at non-vertical directions. Both top and bottom nickel electrodes of the PZT transducer are patterned into sector electrodes. Asymmetric acoustic fields are generated from the "pie-shaped" sector electrodes, in contrast to symmetric acoustic fields generated from circular electrodes. The electric field applied across the thickness of the piezoelectric PZT causes the PZT to vibrate, producing acoustic waves. Since, to the first order, the vibrations happen only at the regions covered with the sector electrodes, uneven acoustic pressure distributions are produced at the liquid surface.

Figure 14:
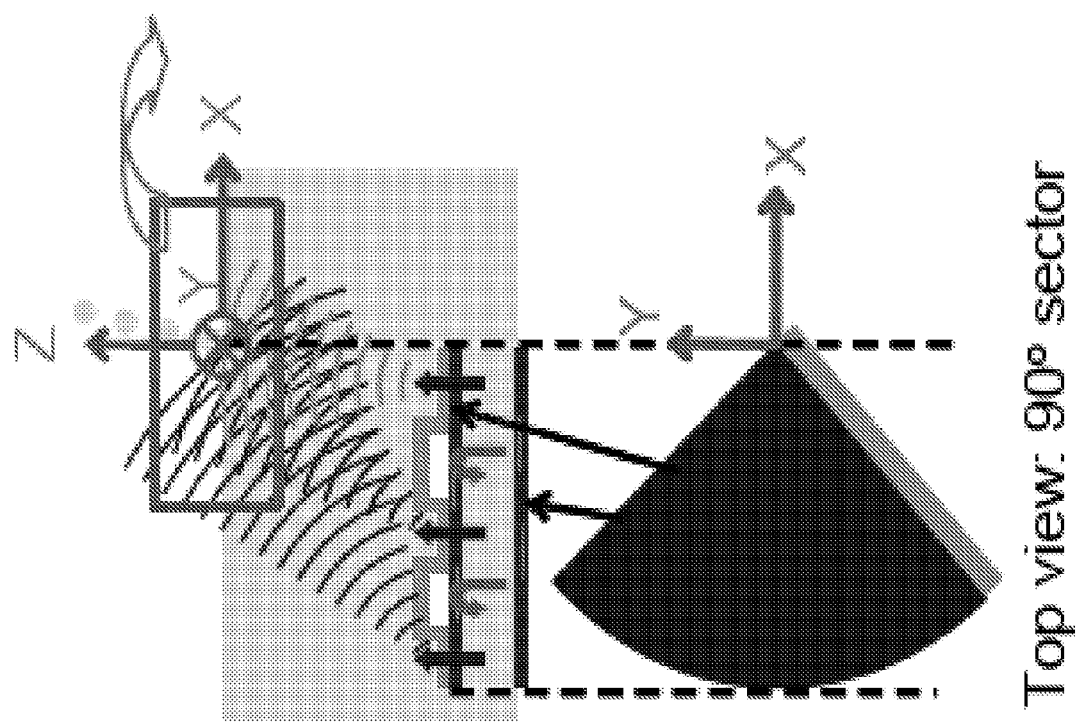
Figure 15:
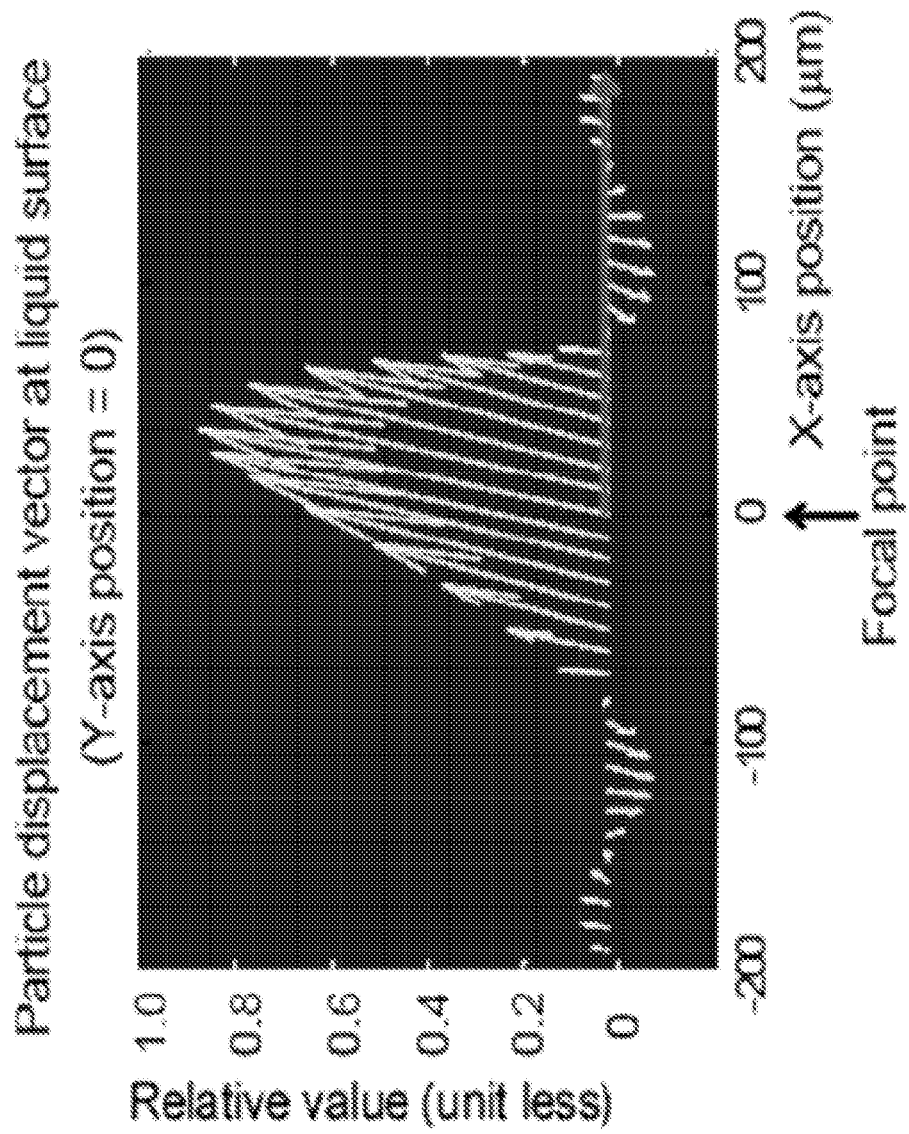

FIG. 14 shows an example of such a directional ejector and FIG. 15 shows the simulation of particle displacements at the liquid surface for 90o sector electrodes of this ejector. As the sector angle decreases, the vertical particle displacement becomes less intensified, while the relative lateral displacement becomes larger. The ejection direction becomes more oblique as the sector angle gets smaller.

Figure 16:
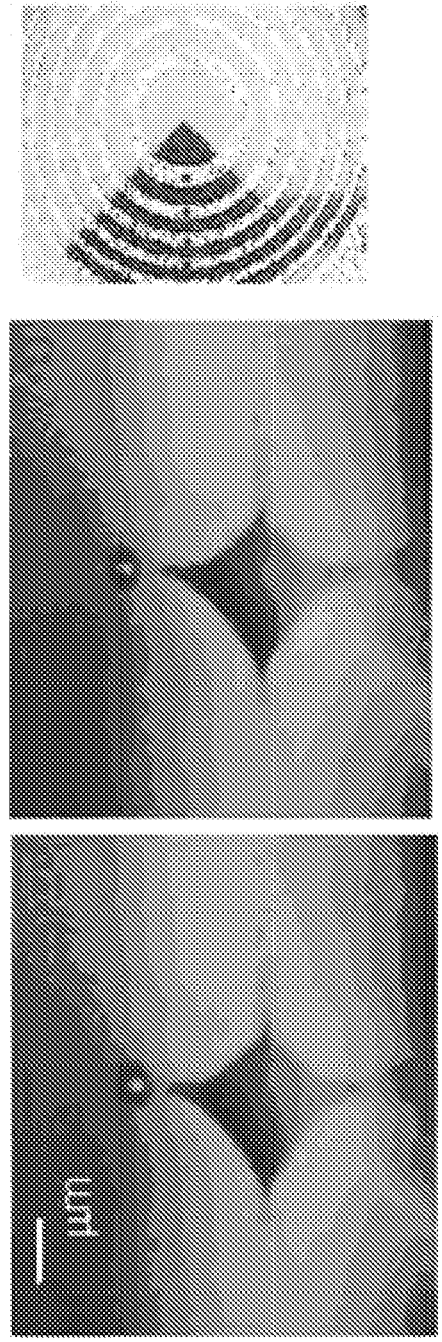

The directional ejectors with a pair of electrodes patterned into various pie-shapes are demonstrated to be capable of ejecting droplets at various oblique angles, as stably as the vertical ejector. FIG. 16 shows the photos of directionally ejected droplets when a directional ejector (whose top view is shown in FIG. 16c) is driven with ±60-Vpeak-to-peak pulses of 18-MHz sinusoidal signals (pulsewidth and pulse repetition frequency are 7 µs and 60 Hz, respectively). The ejection is one droplet per pulse, free of satellite droplets, and continuously stable. The photo taken right at the beginning of the ejection (FIG. 16a) is almost identical to the one taken after 30 seconds of ejections (i.e., after 1,800 droplet ejections) (FIG. 16b).

Figure 17:
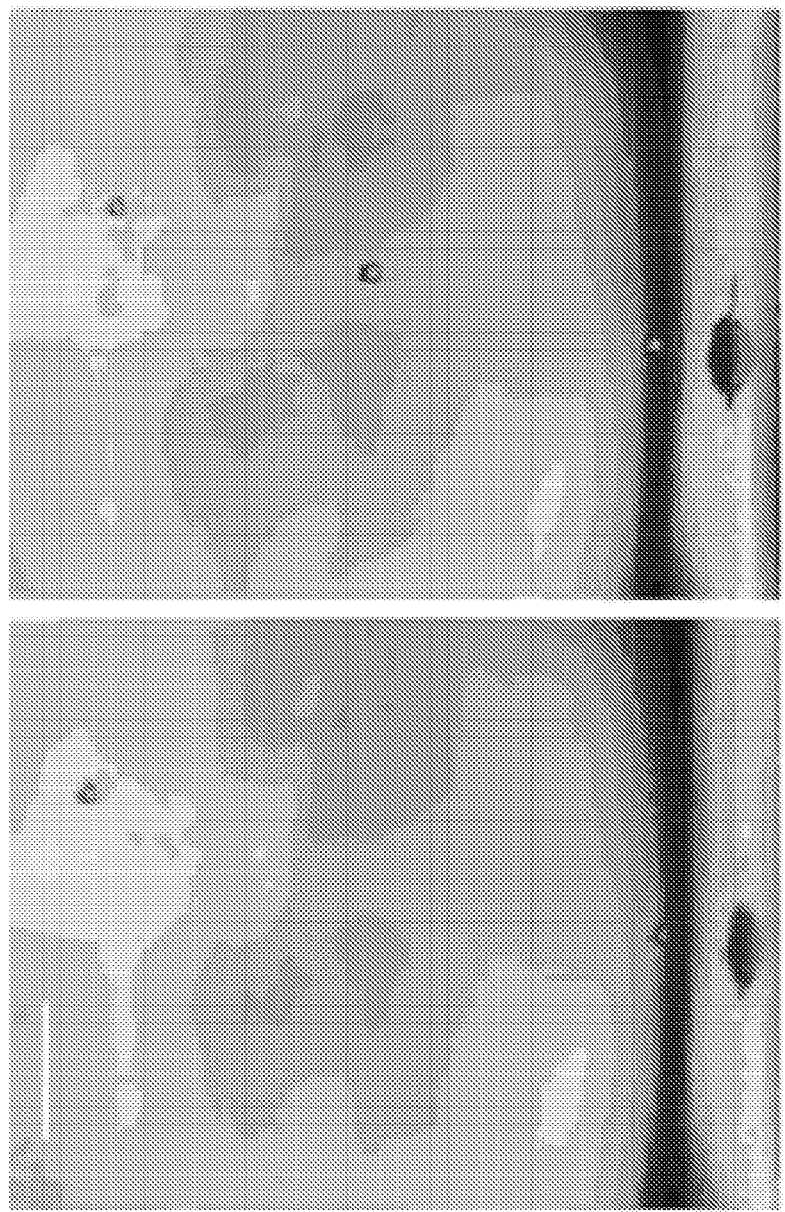

FIG. 17 shows the directional ejections at ejection rates of 1 and 2 kHz.

Figure 18:
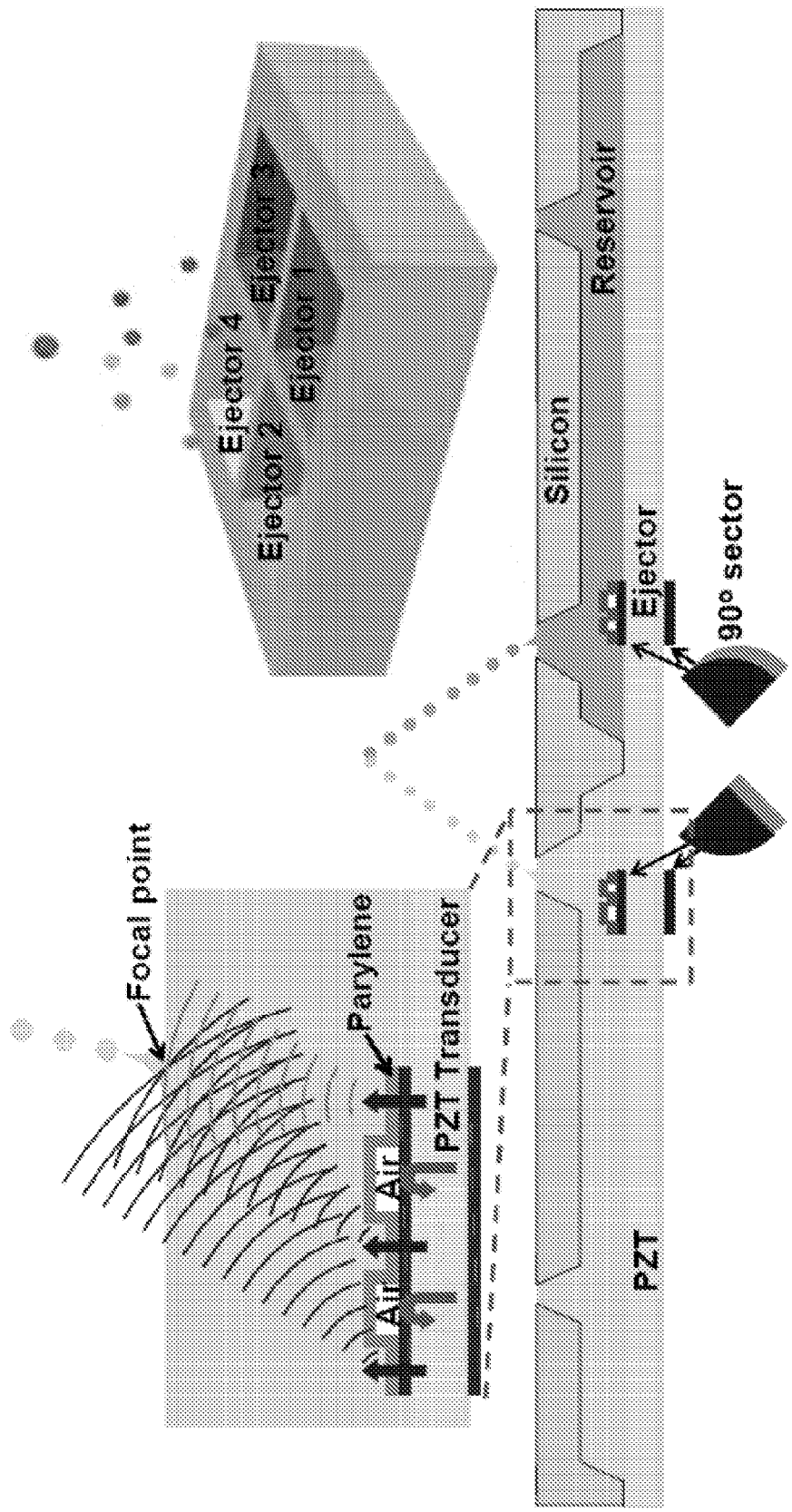

FIG. 18 illustrates another design a directional ejector with four ejectors. A lead zirconate titanate (PZT) transducer with both top and bottom electrodes patterned into a sector shape. Acoustic waves are produced from the regions covered with patterned electrodes, resulting in uneven acoustic pressure distributions on the liquid surface. Among the various patterns investigated, sectors with larger angles would incur lesser tilting for directional ejections, while smaller angles would suffer from severe electric fringing fields and consequent unstable ejections. There existed a tradeoff between directionality and stability, and a 90o sector was observed to be the optimal design. Four ejectors were coordinately arrayed on a single chip to target one spot in the center with multiple liquids.

To fabricate the device, we first sectored top and bottom nickel electrodes on a 127-µm-thick PZT. Parylene was then deposited and patterned as the lens structure with photoresist as the sacrificial layer. After release, we adhesively bonded the PZT substrate to silicon wafers on which the 800-µm-deep (matching the lens focal length) reservoirs were microfabricated.

FIGS. 19A and 19B show the photos of the fabricated PZT ejectors and silicon chambers before they were adhesively bonded together.

FIGS. 20A and 20B show the finished device in a dual-in-line package.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations and enhancements may be made.

What is claimed is:

1. An acoustic transducer device, comprising:
an acoustic unit to generate an acoustic wave; and
an acoustic Fresnel lens formed on one side of the acoustic unit to focus the acoustic wave and structured to comprise (1) concentric annular Fresnel rings that are made of an acoustic transmitting material and transmit acoustic energy and (2) acoustic blocking rings that interleave with the Fresnel rings and block transmission of acoustic energy, wherein the acoustic blocking rings include a material that is different from the acoustic transmitting material.

2. The device as in claim 1, wherein:
the acoustic unit comprises:
a piezoelectric layer that exhibits an piezoelectric effect under a control voltage;
a first contiguous conductive layer formed on a first side of the piezoelectric layer as a first electrode; and
a second contiguous conductive layer formed on a second, opposite side of the piezoelectric layer as a second electrode which is electrically biased with respect to the first electrode to apply the control voltage to the piezoelectric layer to cause the piezoelectric layer to generate the acoustic wave,
wherein the acoustic Fresnel lens is formed on the second electrode of the acoustic unit.

3. The device as in claim 1, wherein:
each acoustic blocking ring comprises a porous material that comprises air cavities and absorbs acoustic energy.

4. The device as in claim 1, wherein:
the concentric annular Fresnel rings are voids located between acoustic blocking rings.

5. The device as in claim 1, wherein:
each acoustic blocking ring is structured to be reflective of acoustic energy.

6. The device as in claim 1, wherein:
the acoustic Fresnel lens comprises a planar structure that includes concentric annular air channel rings as the acoustic blocking rings.

7. The device as in claim 6, wherein:
the planar structure is made of a polymer material.

8. The device as in claim 1, wherein:
the acoustic unit is asymmetrically shaped to produce an asymmetrically shaped acoustic wave.

9. The device as in claim 1, wherein:
the acoustic unit is symmetrically shaped to produce a symmetrically shaped acoustic wave.

10. The device as in claim 1, comprising:
side walls formed over the acoustic Fresnel lens to construct a reservoir that stores a liquid material,
wherein the acoustic Fresnel lens focus the acoustic wave to a selected location at or near a surface of the liquid material in the reservoir to eject a drop of the liquid material from the rest of the liquid material.

* * * * *

UNITED STATES PATENT AND TRADEMARK OFFICE
CERTIFICATE OF CORRECTION

PATENT NO. : 7,719,170 B1
APPLICATION NO. : 12/013413
DATED : May 18, 2010
INVENTOR(S) : Eun Sok Kim, Hongyu Yu and Chuang-Yuan Lee It is certified that error appears in the above-identified patent and that said Letters Patent is hereby corrected as shown below:

Col. 1, Line 16-17
Please replace the paragraph immediately after "FEDERALLY SPONSORED RESEARCH OR DEVELOPMENT" with the following new paragraph:

This invention was made with government support under ECS0310622 awarded by the National Science Foundation. The government has certain rights in the invention.

Signed and Sealed this

Twelfth Day of October, 2010

David J. Kappos
*Director of the United States Patent and Trademark Office*